US006169886B1

United States Patent
Black et al.

(10) Patent No.: US 6,169,886 B1
(45) Date of Patent: Jan. 2, 2001

(54) POWER AMPLIFIER CONTROL ACCORDING TO A DELAYED WAVEFORM SUITABLE FOR USE IN A COMMUNICATION DEVICE

(75) Inventors: Gregory R. Black, Vernon Hills, IL (US); Alexander W. Hietala, Phoenix, AZ (US)

(73) Assignee: Motorola, Inc., Schaumburg, IL (US)

( * ) Notice: Under 35 U.S.C. 154(b), the term of this patent shall be extended for 0 days.

(21) Appl. No.: 09/184,614

(22) Filed: Nov. 2, 1998

(51) Int. Cl.[7] .................................................. H04B 7/00
(52) U.S. Cl. ........................ 455/127; 455/126; 455/522; 455/69
(58) Field of Search ..................... 330/280, 279; 455/115, 126, 127, 522, 69

(56) References Cited

U.S. PATENT DOCUMENTS

| 5,101,175 | * | 3/1992 | Vaisanen | 330/279 |
| 5,150,075 |   | 9/1992 | Hietala et al. | 330/279 |
| 5,675,611 | * | 10/1997 | Lehtinen et al. | 375/297 |
| 5,677,962 | * | 10/1997 | Harrison et al. | 330/280 |
| 5,884,153 | * | 3/1999 | Okada | 455/243.1 |
| 5,977,833 | * | 11/1999 | Attimont et al. | 330/297 |
| 5,982,760 | * | 11/1999 | Chen | 370/335 |
| 5,999,829 | * | 12/1999 | Chun et al. | 455/572 |
| 6,047,169 | * | 4/2000 | Dent | 455/127 |

FOREIGN PATENT DOCUMENTS

| 0434294A2 | 6/1991 | (EP) . |
| 0537690A2 | 4/1992 | (EP) . |
| WO 92/22135 | 10/1992 | (WO) . |

* cited by examiner

Primary Examiner—Reinhard J. Eisenzopf
Assistant Examiner—Duc Nguyen
(74) Attorney, Agent, or Firm—Mark D. Patrick; Hisashi D. Watanabe (57) ABSTRACT

A wireless communication device (202), such as a cellular telephone, has a power amplifier (218) and a power amplifier control (222). The power amplifier (218) is selectively controllable to amplify, to different output power levels, a signal for transmission. In a high power mode requiring amplification of the signal to a high output power level, the power amplifier control (222) controls the power amplifier to amplify the signal according to a predetermined amplitude waveform (106). In a low power mode requiring amplification of the signal to a low output power level, the power amplifier control controls the power amplifier to amplify the signal according to a delayed one of the predetermined amplitude waveform (300).

14 Claims, 6 Drawing Sheets

POWER AMPLIFIER CONTROL ACCORDING TO A DELAYED WAVEFORM SUITABLE FOR USE IN A COMMUNICATION DEVICE

FIELD OF THE INVENTION

This invention relates, generally, to power amplifiers of communication devices and, more particularly, to facilitating control of such power amplifiers according to a delayed waveform.

BACKGROUND OF THE INVENTION

Power amplifiers are used in wireless communication devices, such as cellular telephones, to facilitate transmission of communication signals. Many communication systems within which the wireless communication devices operate require each wireless communication device to meet certain time and frequency requirements. One such system is the Global System for Mobile Communications (GSM) system. In the GSM system, multiple GSM cellular telephones share a single 200 kHz wide channel on which to transmit communication signals at different output power levels. Each GSM cellular telephone on a channel is allocated one 577 microsecond ($\mu$sec) time slot on a repetitive basis. During this time slot the cellular telephone ramps up its power amplifier to the proper frequency and output power level, transmits desired data and ramps down its power amplifier so as not to disturb or interfere with the other cellular telephone users sharing the same frequency. To ensure operation as described, the cellular telephones must, at all times, comply with a spectral frequency mask and a time mask. For example, time masks 100 and 102 corresponding to output power levels 13 dbm (power level in dB with respect to 1 milliwatt) and 33 dbm, respectively, are shown in dotted line in FIG. 1. During the ramp-up of the power amplifier to the output power levels 13 dbm and 33 dbm, the output power of the power amplifier must at all times remain within the time masks 100 and 102, respectively. Such is accomplished by, for example, ramping-up the power amplifier to the output power levels of 13 dbm and 33 dbm according to curves 104 and 106 of FIG. 1, respectively.

Figure 1:
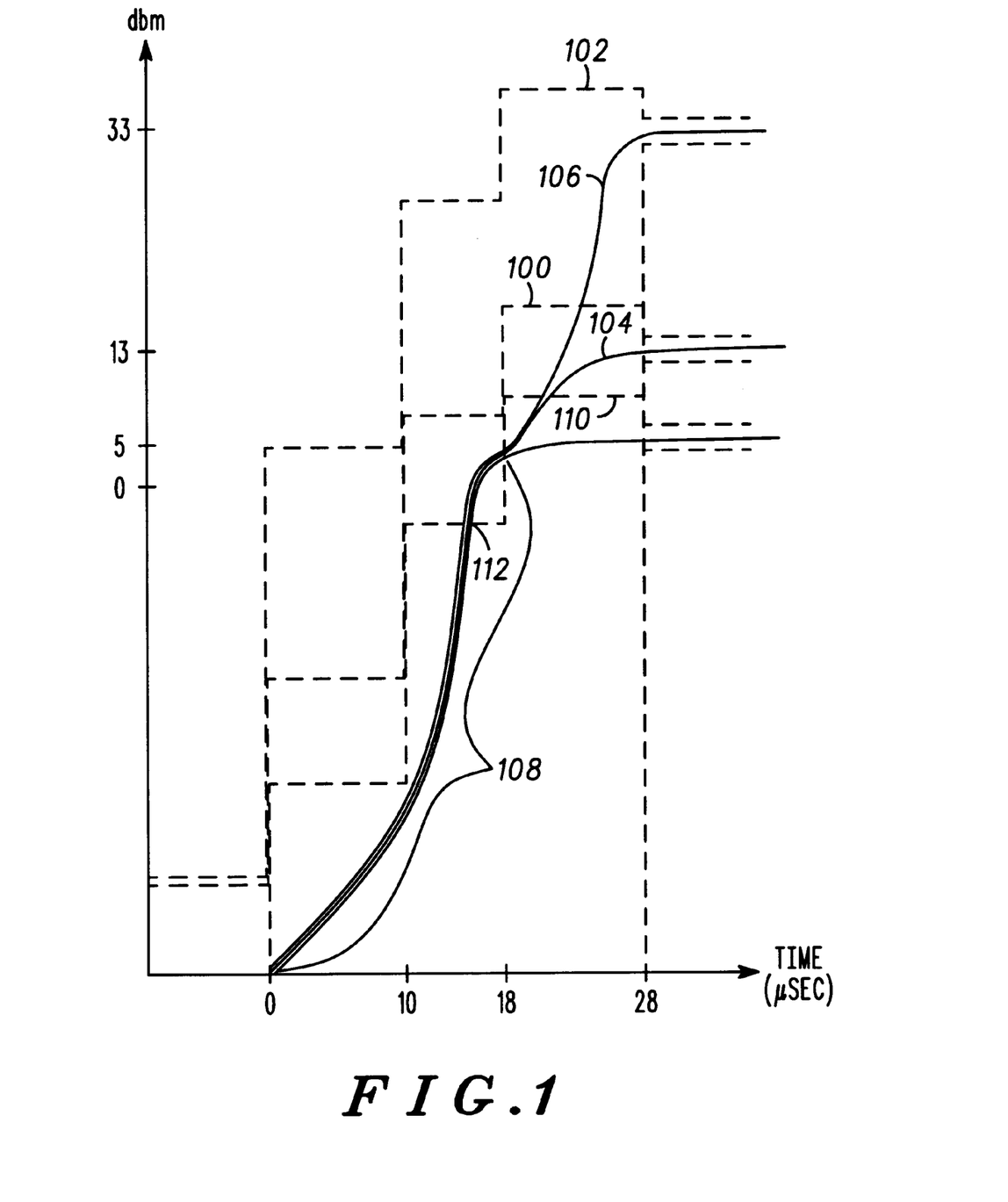
FIG. 1 is a power versus time graph showing GSM time masks associated with different output power levels and predetermined amplitude waveforms describing power amplifier ramp-up to different output power levels, at least one of the predetermined amplitude waveforms describing a suitable power amplifier ramp-up to a high output power level.

While the exact shape may vary, the curves 104 and 106 should initially have a somewhat steep ramp-up portion with an increasing slope, such as portion 108 of the curves 104 and 106. A ramp-up portion, such as the portion 108, is optimal to ensure that the power amplifier is not turned on and ramped-up too slowly, which can cause severe damage to the data to be transmitted, or turned on and ramped-up too quickly, which can cause large spectrum bursts that interfere with other cellular telephones operating at the same or similar frequencies.

Unfortunately, ramping-up the power amplifier to lower output power levels, such as 5 dbm, using the somewhat steep ramp-up portion with an increasing slope, such as the portion 108, violates a time mask 110 of the 5 dbm output power level. The violation occurs at point 112 in FIG. 1. Recently, the European Telecommunications Standards Institute defined the GSM Digital Telecommunication System (Phase 2) Mobile Station Conformance Specification ("GSM Phase 2"). GSM Phase 2requires that GSM cellular telephones be able to transmit at lower power levels, including but not limited to the 5 dbm level discussed above.

Therefore, what is needed is a way to facilitate transmission at lower power levels in a communication system defined by time and frequency spectrum requirements without sacrificing data integrity or causing spectrum interference.

DETAILED DESCRIPTION OF THE DRAWINGS

A wireless communication device, such as a cellular telephone, has a power amplifier and a power amplifier control. The power amplifier is selectively controllable to amplify, to different output power levels, a signal for transmission. In a high power mode requiring amplification of the signal to a high output power level, the power amplifier control controls the power amplifier to amplify the signal according to a predetermined amplitude waveform. In a low power mode requiring amplification of the signal to a low output power level, the power amplifier control controls the power amplifier to amplify the signal according to a delayed one of the predetermined amplitude waveform. By ramping-up amplifier output power according to a delayed waveform, a wireless communication device can transmit at lower output power levels and meet strict time and frequency spectrum requirements, such as those defined in GSM Phase 2.

Figure 2:
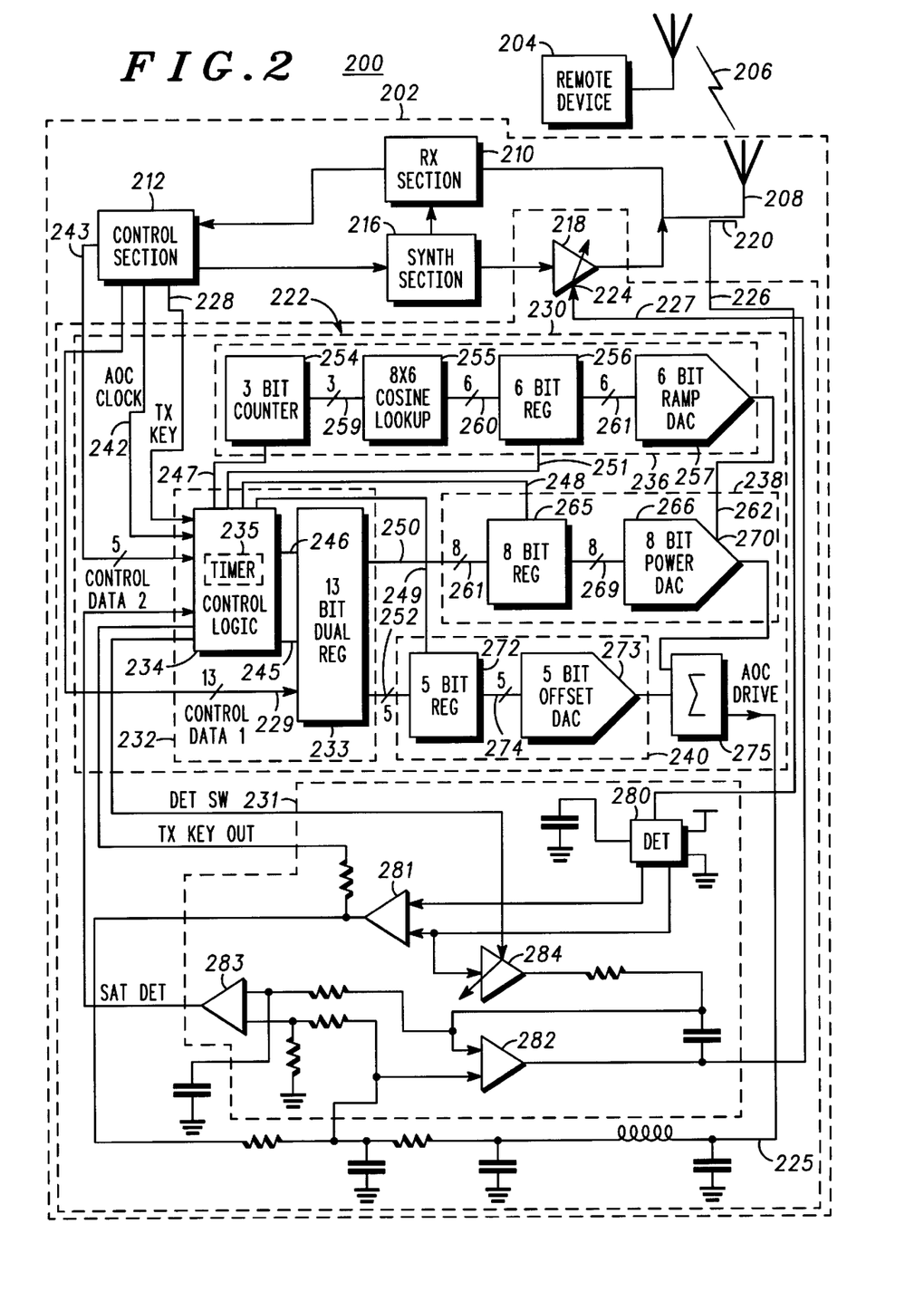
FIG. 2 is a partial block/partial schematic diagram showing a wireless communication device employing a power amplifier and a power amplifier control having a waveform generator.

A communication system 200 shown in FIG. 2 includes a local wireless communication device 202 that communicates with a remote communication device 204 via a signaling link 206. As illustrated in FIG. 2, the system 200 is a cellular telephone system, the local device 202 is a cellular telephone, the remote device 204 is a cellular base station and the signaling link 206 is made up of radio frequency (RF) signals. In one embodiment, the local device 202 is a cellular telephone capable of operating in accordance with GSM Phase 2, the system 200 is a GSM system employing time division multiple access and the signaling link 206 is a channelized frequency band of multiple 200 kHz wide channels wherein each channel has repetitive frames of multiple 577 μsec time slots. Communication between the local device 202 and the system 200 is facilitated by the remote device 204, which allocates a time slot during which the local device 202 receives information from, and transmits information to, the remote device 204 using RF signal bursts.

As a cellular telephone, the local device 202 has an antenna 208; a receive section 210 coupled to the antenna 208; a control section 212 coupled to the receive section 210; a transmit section 214 coupled to the antenna 208 and the control section 212; and a synthesizer section 216 coupled to the receive section 210, the control section 212 and the transmit section 214. The antenna 208 operates to couple RF signal bursts to and from the signaling link 206. The receive section 210 operates to receive the RF signal burst from the remote device 204 at the antenna 208 during the time slot allocated to the local device 202 and converts the received RF signal burst for processing and information extraction by the control section 212. The synthesizer section 216 operates to tune the receive section 210 for reception and formats an information signal generated by the control section 212 for transmission to the remote device 204. The transmit section 214 operates to amplify the information signal generated by the synthesizer section 216 for transmission as RF signal bursts during the time slot allocated to the local device 202.

The local device 202 sets its amplification or output power level according to information received from the remote device 204. In accordance with GSM Phase 2, the transmit section 214 must be able to set its output power level to low output power levels 11 dbm, 9 dbm, 7 dbm and 5 dbm and to high output power levels 33 dbm, 31 dbm, 29 dbm, 27 dbm, 25 dbm, 23 dbm, 21 dbm, 19 dbm, 17 dbm, 15 dbm and 13 dbm. In reaching the desired output power level, the local device 202 must ramp-up its output power without violating the GSM spectral frequency and time masks, as previously described in the Background. For the high output power levels, the curves 104 and 106 of FIG. 1, which are predetermined amplitude waveforms in compliance with the time masks 100 and 102, respectively, are representative of the output power ramp-up followed by the local device 202. For the low output power levels, curve 300 of FIG. 3, which is a predetermined amplitude waveform in compliance with time mask 302, is representative of the output power ramp-up followed by the local device 202. A quick comparison shows that curve 300 is advanced along the time axis or delayed with respect to curves 104 and 106. Also, a ramp-up portion 304 of the curve 300 is steeper than the ramp-up portion 108 of curves 104 and 106.

Figure 3:
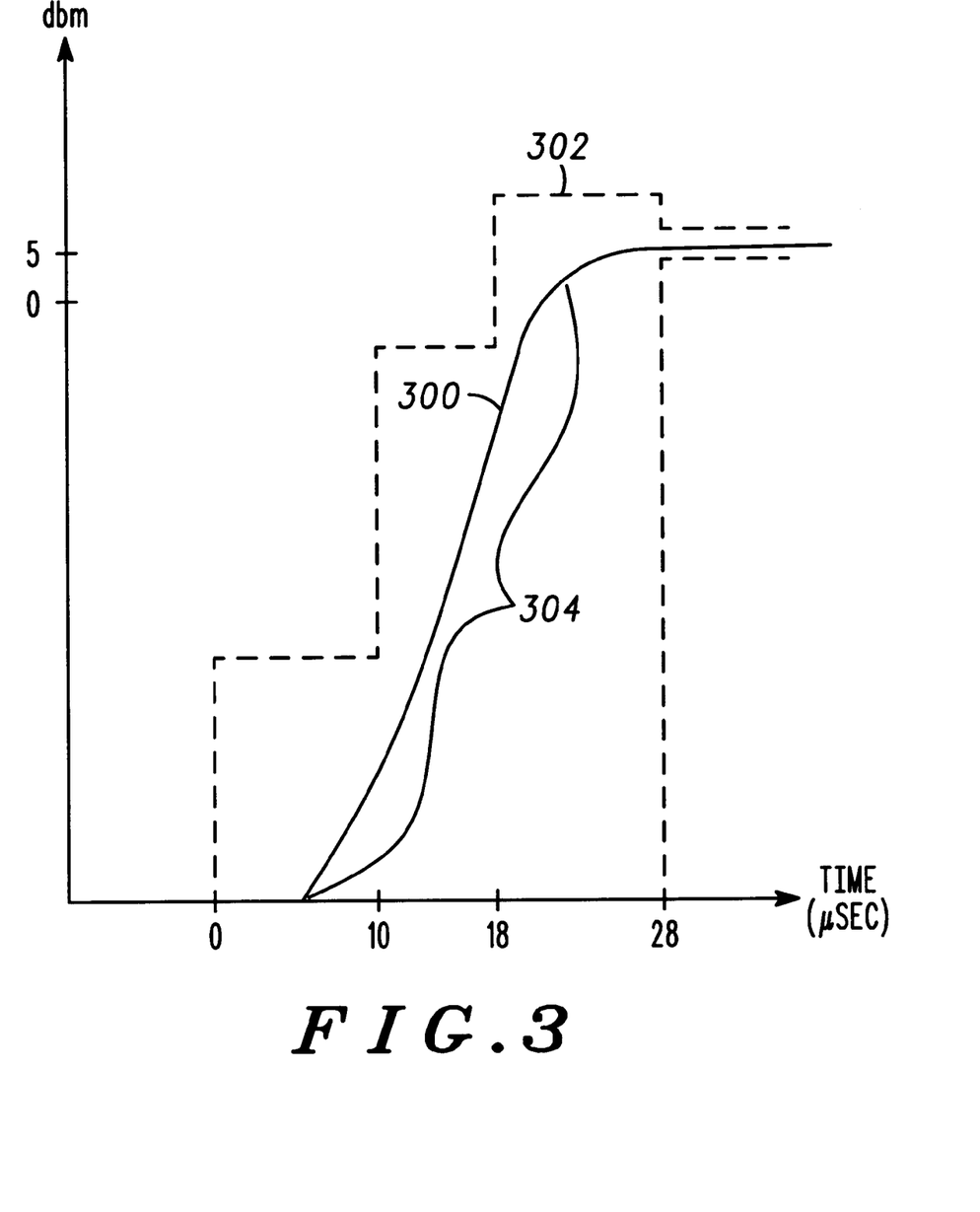
FIG. 3 is a power versus time graph showing a GSM time mask associated with a low output power level and a delayed one of the predetermined amplitude waveforms of FIG. 1 describing a suitable ramp-up of the power amplifier of FIG. 2 to the low output power level.

To facilitate the output power ramp-up depicted by curves 104, 106 and 300 of FIGS. 1 and 3, the transmit section 214 of FIG. 2 employs a power amplifier 218, a coupler 220 and a power amplifier control 222. The power amplifier 218 is a RF power amplifier. The power amplifier 218 amplifies signals output by the synthesizer section 216 for transmission via the antenna 208. The level of amplification of the power amplifier 218 is directly proportional to the voltage level of a control signal at a control port 224 of the power amplifier 218. The coupler 220 is a directional electromagnetic coupler coupled at the output of the power amplifier 218. The coupler 220 generates a signal on connection 226 that is representative of the actual output power of the power amplifier 218. The power amplifier control 222 controls the power amplifier 218 at the control port 224 responsive to the control section 212 and the coupler 220. The power amplifier control 222 has a waveform generation section 230 and a feedback control and saturation detection section 231.

The waveform generation section 230 generates an amplifier control signal AOC (Automatic Output Control) DRIVE on connection 225 in response to the presence of a logic high state of an initiate transmit signal TX KEY output by the control section 212 on connection 228. The signal AOC DRIVE is applied via the feedback control and saturation detection section 231 to the control port 224 of the power amplifier 218 via connection 227.

The feedback control and saturation detection section 231 has intercoupled control loops that communicate with the waveform generation section via a feedback gain adjust signal DET SW, a signal TX KEY OUT which follows the signal TX KEY and a saturation detection signal SAT DET. The feedback control and saturation detection section 231 has a detector 280, comparators 281 and 283 and an integrator 282 that are interconnected to detect when the power amplifier 218 nears or enters saturation and to vary, when necessary, the signal AOC DRIVE so that desired output power corresponds to actual output power indicated in the signal fed back from the coupler 220 on connection 226. Further description of the operation of the detector 280, the comparators 281 and 283 and the integrator 282 and the accompanying resistor, capacitor and inductor components may be found in U.S. Pat. No. 5,150,075 by Hietala et al., entitled "Power amplifier Ramp Up Method and Apparatus," issued on Sep. 22, 1992 and assigned to Motorola, Inc. An amplifier 284 is used by the feedback control and saturation detection section 231 to limit the signal fed back from the coupler 220 to the operating range of the integrator 282. Because the discussion herein focuses primarily on accommodating ramp-up of the power amplifier 218 to low output power levels and the power amplifier 218 is not susceptible to saturation during ramp-up to low output power levels, the discussion below will not further focus on saturation detection and correction capabilities of the power amplifier control 222 except as is necessary to describe the waveform generation section 230.

Figure 4:
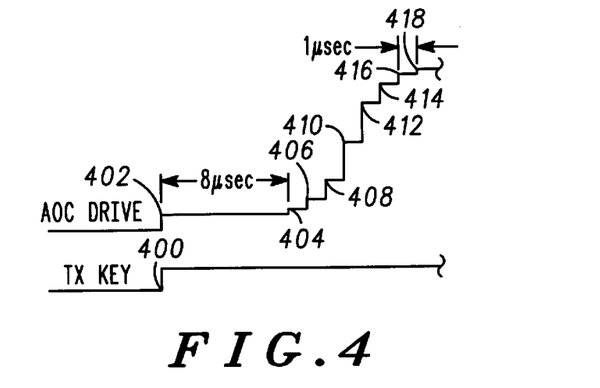
FIG. 4 is a timing diagram showing an amplifier control signal generated by the waveform generator of the power amplifier control of FIG. 2 to ramp-up the power amplifier to a high output power level in accordance with the at least one of the predetermined amplitude waveforms of FIG. 1.
Figure 7:
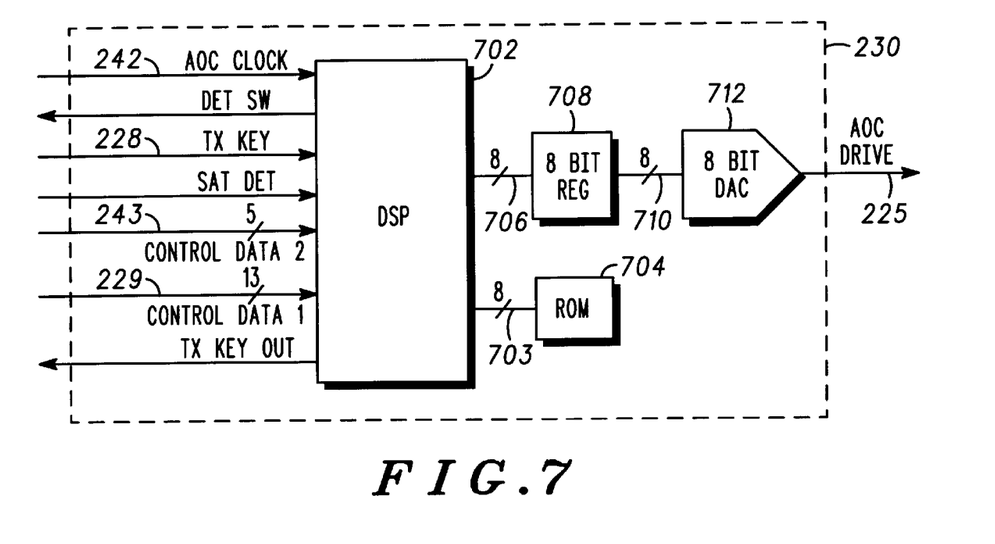
FIG. 7 is a partial block/partial schematic diagram showing an alternate waveform generator of the power amplifier control of FIG. 2.

To ramp-up the power amplifier 218 to a high output power level in accordance with, for example, the predetermined amplitude waveforms represented by the curves 104 or 106 of FIG. 1, the waveform generation section 230 operates in a high power mode and generates the signal AOC DRIVE according to FIG. 4. To ramp-up the power amplifier 218 to a low output power levels in accordance with, for example, the delayed one of the predetermined amplitude waveforms represented by the curve 300 of FIG. 3, the waveform generation section 230 operates in a low power mode and generates the signal AOC DRIVE according to FIG. 5. Examples of apparatus suitable for generating the signal AOC DRIVE according to FIGS. 4 and 5 are shown in FIGS. 2 and 7.

FIG. 2 depicts a hardware implementation of the waveform generation section 230. The hardware implementation includes control circuitry 232, a ramp generator 236, a power level generator 238 and an offset generator 240. The ramp generator 236 employs a three bit counter 254, a lookup table 255 storing eight six bit values representing ramp steps corresponding to a raised cosine waveform, a six bit register 256 and a six bit digital-to-analog converter (DAC) 257. The counter 254 is serially coupled to the table 255 by a connection 259, which has the capacity to carry three bits in parallel. The table 255, the register 256 and the DAC 257 are serially intercoupled by connections 260 and 261, each of which has the capacity to carry six bits in parallel. The power level generator 238 employs an eight bit register 265 and an eight bit DAC 266 having a multiply input port 270 driven by the output of the DAC 257 of the ramp generator 236 via connection 262. The register 265 and the DAC 266 are serially coupled by a connection 269, which has the capacity to carry eight bits in parallel. The offset generator 240 employs a five bit register 272 and a five bit DAC 273. The register 272 and the DAC 273 are serially coupled by a connection 274, which has the capacity to carry five bits in parallel. The outputs of the DACs 266 and 273 are added by a summer 275 of the waveform generation section 230 to form the signal AOC DRIVE on connection 225. The control circuitry 232 employs a 13 bit dual register 233 and control logic 234. The 13 bit dual register 233 is coupled to the control section 212 by a connection 229, which has a capacity to carry 13 bits in parallel. An eight bit register portion of the dual register 233 is coupled to the eight bit register 265 of the power level generator 238 by a connection 250, which has the capacity to carry eight bits in parallel. A five bit register portion of the dual register 233 is coupled to the five bit register 272 of the offset generator 240 by a connection 252, which has the capacity to carry five bits in parallel. The control logic 234 has a timer 235. The control logic 234 is coupled to the control section 212 by connections 228, 242 and 243, wherein the connection 243 has the capacity to carry five bits in parallel. The control logic 234 is coupled to the three bit counter 254 of the ramp generator 236 and the six bit register 256 of the ramp generator 236 by respective connections 247 and 251, to the eight bit register 265 of the power level generator 238 by a connection 248, to the five bit register 272 of the offset generator 240 by a connection 249, to the eight bit register portion of the 13 bit dual register 233 by a connection 246 and to the five bit register portion of the 13 bit dual register 233 by a connection 245.

Figure 5:
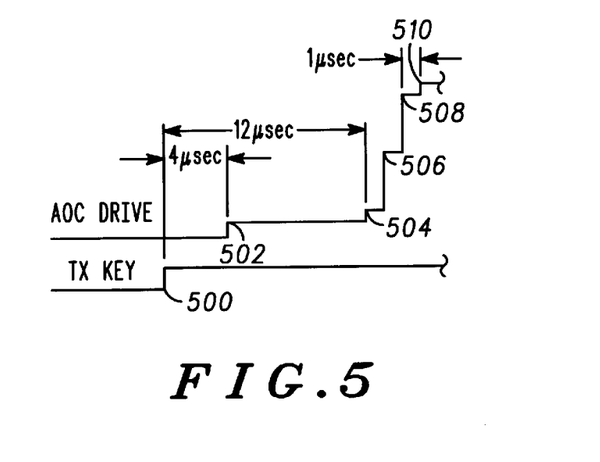
FIG. 5 is a timing diagram showing an amplifier control signal generated by the waveform generator of the power amplifier control of FIG. 2 to ramp-up the power amplifier to a low output power level in accordance with the delayed one of the predetermined amplitude waveforms of FIG. 3.
Figure 6:
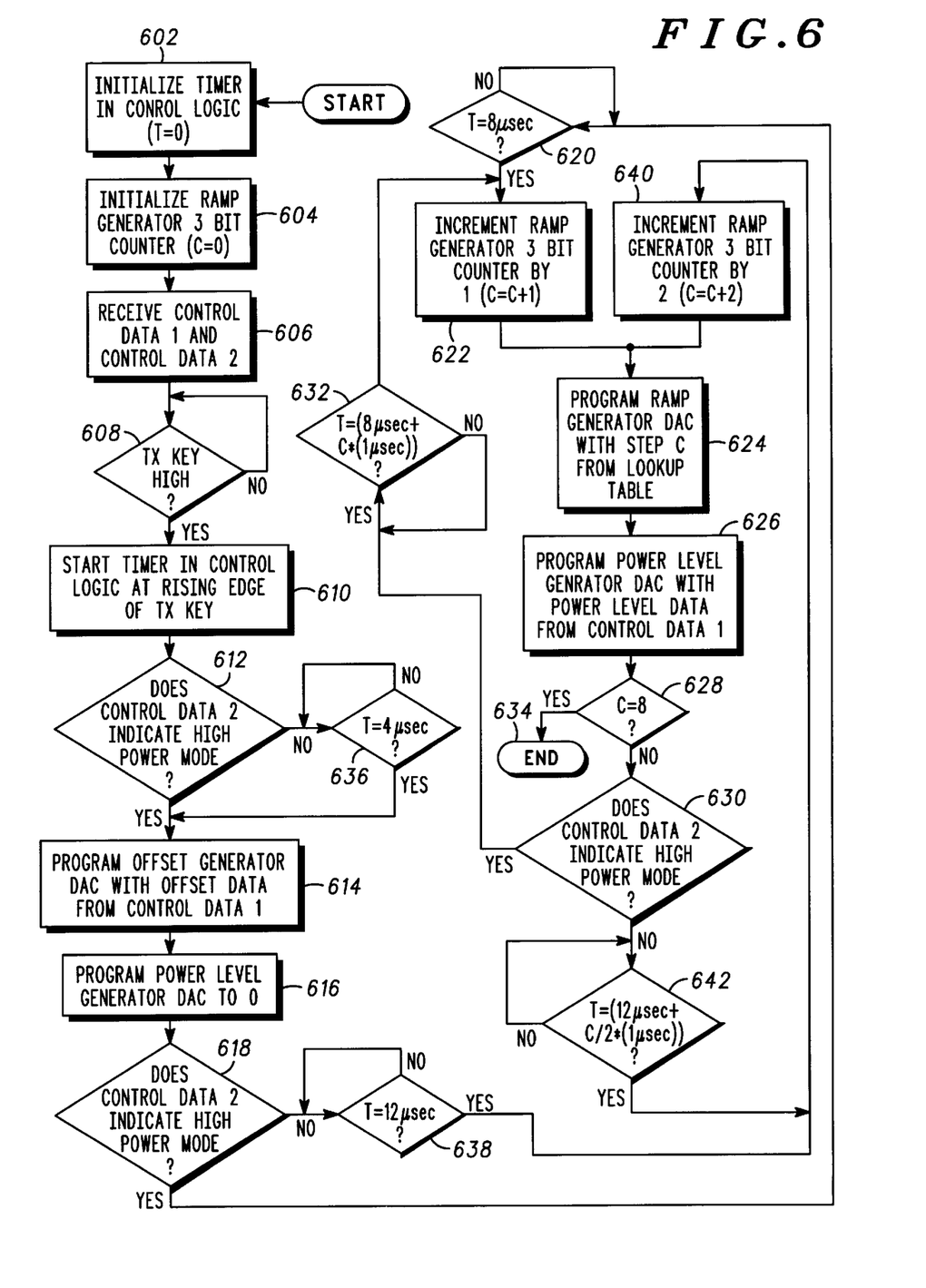
FIG. 6 is a flow chart illustrating a method of controlling the waveform generator of the power amplifier control of FIG. 2 to generate the amplifier control signals shown in FIGS. 4 and 5.

To produce the signal AOC DRIVE as depicted in FIGS. 4 and 5, the hardware implementation of the waveform generation section 230 shown in FIG. 2 operates in accordance with a method illustrated in FIG. 6. The method of FIG. 6 is described below with reference to FIGS. 2, 4 and 5. The control logic 234 performs initial operations, which include resetting or initializing the timer 235 to zero (i.e., T=0) (at block 602) and resetting or initializing the three bit counter 254 of the ramp generator 236 to zero (i.e., C=0) (at block 604).

Signals CONTROL DATA 1 and CONTROL DATA 2 sent by the control section 212 are received by the 13 bit dual register 233 via the connection 229 and the control logic 234 via the connection 243, respectively (at block 606). The signal CONTROL DATA 1 contains eight bits of power level data defining the output power level that the power amplifier 218 is to be ramped-up to and five bits of offset data. The offset data is defined to match the built-in DC (direct current) offset of the detector 280. The 13 bit dual register 233 loads the eight bits of power level data into the eight bit register portion of the dual register 233. The 13 bit dual register 233 loads the five bits of offset data into the five bit register portion of the dual register 233. The signal CONTROL DATA 2 contains 4 bits of saturation detection and correction data and 1 bit of power mode data defining whether the waveform generation section 230 should operate in a high power mode or low power mode.

Upon detecting that the signal TX KEY output by the control section 212 on the connection 228 goes to a logic high state (at block 608), the control logic 234 starts the timer 235 at the rising edge of the signal TX KEY, which is referenced in FIGS. 4 and 5 by 400 and 500, respectively (at block 610). The timer 235 increments according to a timing signal AOC CLOCK received by the control logic 234 from the control section 212 via the connection 242. The signal AOC CLOCK is a train of 1 $\mu$sec clock pulses.

If the power mode data of the signal CONTROL DATA 2 indicates a high power mode, such as by having a logic low state (at blocks 612, 618 and 630), the control logic 234 drives the waveform generation section 230 to generate the signal AOC DRIVE as it is depicted in FIG. 4. At the rising edge 400 of the signal TX KEY, the control logic 234 programs the DAC 273 of the offset generator 240 with the offset data from the signal CONTROL DATA 1 (at block 614) and programs the DAC 266 of the power level generator 238 to zero (at block 616). To program the DAC 273, the control logic 234 triggers the five bit register portion of the 13 bit dual register 233 via connection 245 to couple the offset data to the five bit register 272 of the offset generator 240 via the connection 252. The control logic 234 further triggers the five bit register 272 via connection 249 to couple the offset data over the connection 274 and to the DAC 273. The DAC 273 converts the offset data into an analog offset signal and outputs the analog offset signal to the summer 275. To program the DAC 266, the control logic 234 triggers the eight bit register 265 of the power level generator 238, which is in a reset state, via the connection 248 to couple all zeros over the connection 269 and to the DAC 266. The DAC 266, which initially has an analog zero signal at its multiply input port 270, converts the zeros into an analog zero signal and outputs the analog zero signal to the summer 275. The summer 275 adds the analog offset signal and the analog zero signal to achieve step 402 of the signal AOC DRIVE, as shown in FIG. 4.

In the high power mode, the control logic 234 holds the programming of the DACs 266 and 273 done in blocks 614 and 616 until 8 $\mu$secs have elapsed on the timer 235 (i.e, 8 $\mu$secs have passed since the rising edge of the signal TX KEY) (at block 620). After 8 $\mu$secs, the control logic 234 increments the three bit counter 254 of the ramp generator 236 by 1 (i.e., C=C+1) (at block 622), programs the DAC 257 of the ramp generator 236 with the step from the lookup table 255 corresponding to the current count (e.g., C) of the three bit counter 254 (at block 624) and programs the DAC 266 of the power level generator 238 with the power level data from the signal CONTROL DATA 1 (at block 626). The control logic 234 increments the three bit counter 254 via the connection 247. Upon incrementing, the three bit counter 254 drives the lookup table 255 over the connection 259 using its current count. In response, the lookup table 255 outputs the six bit ramp step, which corresponds to the current count, to the six bit register 256 via the connection 260. It is understood that the three bit counter 254 counts sequentially in binary from "000" to "111"; however, for purposes of clarity, C=1 shall refer to the count "000," C=2 shall refer to the count "001," C=3 shall refer to the count "010," C=4 shall refer to the count "011," C=5 shall refer to the count "100," C=6 shall refer to the count "101," C=7 shall refer to the count "110" and C=8 shall refer to the count "111." To program the DAC 257, the control logic 234 triggers the six bit register 256 via connection 251 to couple the ramp step over the connection 261 and to the DAC 257. The DAC 257 converts the ramp step into an analog ramp step signal and outputs the analog ramp step signal to the multiply input port 270 of the DAC 266. To program the DAC 266, the control logic 234 triggers the eight bit register portion of the 13 bit dual register 233 via connection 246 to couple the power level data over the connection 250 and to the eight bit register 265 of the power level generator 238. The control logic 234 further triggers the eight bit register 265 via connection 248 to couple the power level data over the connection 269 and to the DAC 266. Conversion by the DAC 266 is driven by the analog ramp step signal at the multiply input port 270 to generate an analog power level signal that is scaled to the first ramp step read from the lookup table 255. The analog scaled power level signal is output by the DAC 266 to the summer 275 where it is added to the analog offset signal to achieve step 404 of the signal AOC DRIVE, as shown in FIG. 4.

In the high power mode, blocks 622, 624 and 626 are repeated every 1 μsec (block 632) until the maximum count of the three bit counter 254 of the ramp generator 236 is reached (i.e., C=8) (at blocks 628, 634). This results in steps 406, 408, 410, 412, 414, 416 and 418 of the signal AOC DRIVE, as shown in FIG. 4. Each one of the steps 406, 408, 410, 412, 414 and 416 as well as step 404 has a 1 μsec duration, as ensured by block 632.

If the power mode data of the signal CONTROL DATA 2 indicates a low power mode, such as by having a logic high state (at blocks 612, 618 and 630), the control logic 234 drives the waveform generation section 230 to generate the signal AOC DRIVE as it is depicted in FIG. 5. In doing so, the control logic 234 will execute the blocks 614, 616, 624, 626, 628 and 634 previously described with respect to the high power mode. However, prior to executing block 614, the control logic 234 waits until 4 μsecs have elapsed on the timer 235 (at block 636). As a result, programming of the DAC 273 with the offset data (at block 614) and programming of the DAC 266 with all zeros (at block 614) is delayed, thereby, creating a delayed step 502 of the signal AOC DRIVE, as shown in FIG. 5. Also, prior to executing block 624, the control logic 234 waits until 12 μsecs have elapsed on the timer 235 (at block 638) and increments the three bit counter 254 of the ramp generator 236 by 2 (i.e., C=C+2) (at block 640). As a result, the DAC 257 will be consecutively programmed with the second, fourth, sixth and eighth ramp steps stored in the lookup table 255, thereby, creating steps 504, 506, 508 and 510 of the signal AOC DRIVE, as shown in FIG. 5. Each one of the steps 504, 506 and 508 has a 1 μsec duration, as ensured by block 642. A comparison of FIGS. 4 and 5 reveal that in both the high and low power modes, the signal AOC DRIVE reaches its top step, step 418 in FIG. 4 and step 510 in FIG. 5, 15 μsecs after the signal TX KEY. However, the signal AOC DRIVE is ramped-up at a steeper rate in the low power mode, just 3 μsecs from step 504 to step 510 in FIG. 5 as compared to 7 μsecs from step 404 to step 418 in FIG. 4.

FIG. 7 depicts an alternate implementation of the waveform generation section 230 employing a digital signal processor (DSP). The DSP implementation includes a DSP 702, a read-only memory (ROM) 704, a register 708 and a DAC 712. The DSP 702 is coupled to the control section 212 by the connections 228, 229, 242 and 243. The ROM 704, which stores unscaled raised cosine waveform steps, is coupled to the DSP 702 by a connection 703, which has the capacity to carry eight bits in parallel. The register 708 is an eight bit register that is coupled to the DSP 702 by a connection 706, which has the capacity to carry eight bits in parallel. The DAC 712 is an eight bit DAC that is coupled to the register 708 by a connection 710, which has the capacity to carry eight bits in parallel. The signal AOC DRIVE is output by the DAC 712 on the connection 225.

Figure 8:
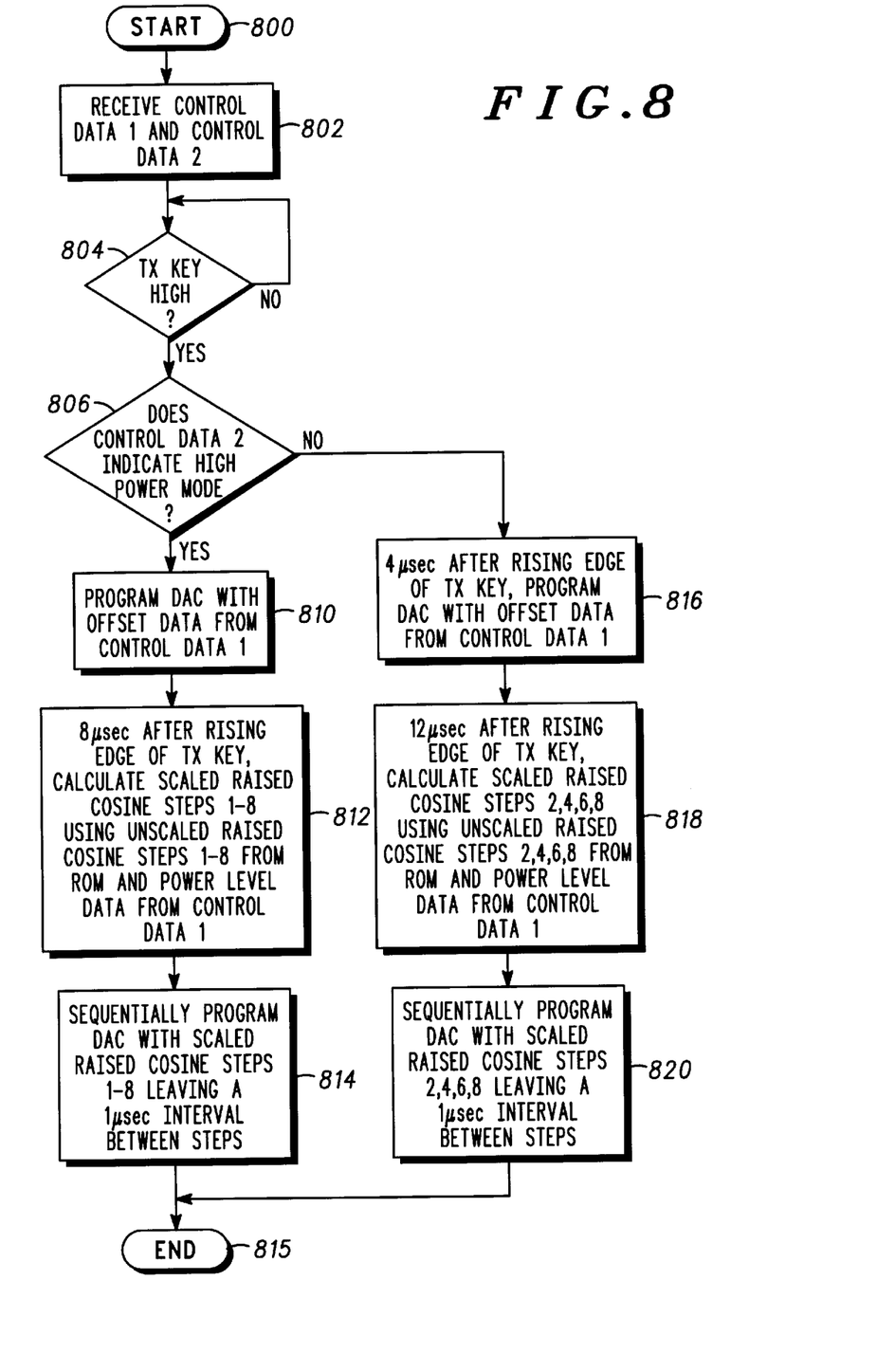
FIG. 8 is a flow chart illustrating a method of controlling the alternate waveform generator of FIG. 7 to generate the amplifier control signals shown in FIGS. 4 and 5.

To produce the signal AOC DRIVE as depicted in FIGS. 4 and 5, the DSP 702 is programmed to operate the implementation of the waveform generation section 230 shown in FIG. 7 in accordance with a method illustrated in FIG. 8. The method of FIG. 8 is described below with reference to FIGS. 4, 5 and 7 At start up, the DSP 702 performs initial tasks, including synchronizing to the signal AOC CLOCK on the connection 242 (at block 800). The DSP 702 receives the signal CONTROL DATA 1 via connection 229 and the signal CONTROL DATA 2 via connection 243 (at block 802). Upon detecting that the signal TX KEY on the connection 228 goes to a logic high state (at block 804) and determining that the power mode data in the signal CONTROL DATA 2 indicates high power mode, the DSP 702 programs the DAC 712 with offset data from the signal CONTROL DATA 1 at the rising edge of the signal TX KEY (at block 810). To program the DAC 712, the DSP 702 couples the offset data over the connection 706 and to the register 708, which couples the offset data to the DAC 712 via the connection 710. The offset data is converted and output by the DAC 712 to define the step 402 of the signal AOC DRIVE, as shown in FIG. 4. 8 μsecs after the rising edge of the signal TX KEY, the DSP 702 calculates scaled raised cosine steps 1 through 8 using both the unscaled raised cosine steps 1 through 8 read from the ROM 704 via the connection 703 and the power level data from the signal CONTROL DATA 1 (at block 812). The DSP 702 sequentially programs the DAC 712 with the scaled raised cosine steps 1 through 8 leaving a 1 μsec interval between steps (at block 814). To program the DAC 712, the DSP 702 couples one-by one and with 1 μsec in between, all of the scaled raised cosine steps over the connection 706 and to the register 708, which couples the scaled raised cosine steps to the DAC 712 via the connection 710. The scaled raised cosine steps are converted and output by the DAC 712 to define the steps 404, 406, 408, 410, 412, 414, 416 and 418 of the signal AOC DRIVE, as shown in FIG. 4 After such programming the method ends (at block 815).

Upon detecting that the signal TX KEY on the connection 228 goes to a logic high state (at block 804) and determining that the power mode data in the signal CONTROL DATA 2 indicates low power mode, the DSP 702 programs the DAC 712 with offset data from the signal CONTROL DATA 1 in the same manner previously described in block 810, but only after 4 μsecs have elapsed from the rising edge of the signal TX KEY (at block 816). This defines the step 502 of the signal AOC DRIVE, as shown in FIG. 5. 12 μsecs after the rising edge of the signal TX KEY, the DSP 702 calculates scaled raised cosine steps 2, 4, 6 and 8 using both the unscaled raised cosine steps 2, 4, 6 and 8 read from the ROM 704 via the connection 703 and the power level data from the signal CONTROL DATA 1 (at block 818). The DSP 702 sequentially programs the DAC 712 in the manner previously described for the high power mode, but with only the scaled raised cosine steps 2, 4, 6 and 8 (at block 820). This defines the steps 504, 506, 508 and 510 of the signal AOC DRIVE, as shown in FIG. 5. After such programming the method ends (at block 815).

As previously discussed, the local device 202 can only transmit during its allocated time slot. As such, the local device 202 must necessarily begin to ramp-down the power amplifier 218 a predetermined amount of time before the time slot ends. The power amplifier control 222 begins ramp-down of the power amplifier 218 when the signal TX KEY on the connection 228 goes to a logic low state. In the embodiments previously discussed, the power amplifier control 222 achieves ramp-down by substantially reversing the method used to ramp-up the power amplifier 218. For example, in the high power mode, the power amplifier control 222 ramps-down the signal AOC DRIVE from step 418 of FIG. 4 by traversing the steps 402, 404, 406, 408, 410, 412, 414, 416 in reverse order (i.e., going from step 418 to step 416 to step 414 to step 412 to step 410 to step 408 to step 406 to step 404 to step 402) with a 1 $\mu$sec delay in traversal between reversed steps 416 and 414, reversed steps 414 and 412, reversed steps 412 and 410, reversed steps 410 and 408, reversed steps 408 and 406 and reversed steps 406 and 404. In the low power mode, the power amplifier control 222 ramps-down the signal AOC DRIVE from step 510 of FIG. 5 by traversing the steps 502, 504, 506 and 508 in reverse order (i.e., going from step 510 to step 508 to step 506 to step 504 to step 502) with a 1 $\mu$sec delay in traversal between reversed steps 508 and 506 and reversed steps 506 and 504.

Thus, it can be seen that by controlling amplifier output power according to a delayed waveform, a cellular telephone can transmit at lower output power levels and still meet strict time and frequency spectrum requirements, such as those defined in GSM Phase 2. While particular embodiments of the present invention have been shown, described, and preferred, modifications may be made. Although shown to be specifically incorporated into a cellular telephone, it will be recognized that ramping-up amplifier output power according to a delayed waveform may also be beneficially used in other portable devices including, but not limited to, two-way radios, two-way pagers, satellite radiotelephones, cordless telephones and the like. It is therefore intended in the appended claims to cover all such changes and modifications which fall within the true spirit and scope of the invention.

What is claimed is:

1. A wireless communication device comprising:
   a power amplifier to amplify a signal for transmission, the power amplifier selectively controllable to amplify the signal to different output power levels; and
   a power amplifier control coupled to the power amplifier, the power amplifier control to control the power amplifier to amplify the signal to a first output power level according to a predetermined amplitude waveform and to control the power amplifier to amplify the signal to a second output power level according to a delayed one of the predetermined amplitude waveform,
   wherein the power amplifier control comprises control logic having a timer, the control logic, responsive to an initiate transmit signal, starting the timer, and the control logic initiating waveform generation corresponding to the predetermined amplitude waveform upon the start of the timer and initiating waveform generation corresponding to the delayed one of the predetermined amplitude waveform after a predetermined period of time has elapsed on the timer.

2. A wireless communication device comprising:
   a power amplifier to amplify a signal for transmission, the power amplifier selectively controllable to amplify the signal to different output power levels; and
   a power amplifier control coupled to the power amplifier, the power amplifier control to control the power amplifier to amplify the signal to a first output power level according to a predetermined amplitude waveform and to control the power amplifier to amplify the signal to a second output power level according to a delayed one of the predetermined amplitude waveform,
   wherein the power amplifier control comprises a lookup table containing a plurality of ramp steps, a first sequence of the plurality of ramp steps corresponding to a ramp-up portion of the predetermined amplitude waveform, and a second sequence of the plurality of ramp steps different from the first sequence corresponding to a ramp-up portion of the delayed one of the predetermined amplitude waveform.

3. A wireless communication device according to claim 2 wherein the plurality of ramp steps represent a raised cosine waveform.

4. A wireless communication device comprising:
   a power amplifier to amplify a signal for transmission, the power amplifier selectively controllable to amplify the signal to different output power levels; and
   a power amplifier control coupled to the power amplifier, the power amplifier control to control the power amplifier to amplify the signal to a first output power level according to a predetermined amplitude waveform and to control the power amplifier to amplify the signal to a second output power level according to a delayed one of the predetermined amplitude waveform,
   wherein the power amplifier control comprises a waveform generator to generate a signal corresponding ramp-up portions of the predetermined amplitude waveform and the delayed one of the predetermined amplitude waveform by multiplying a power level by a plurality of ramp steps, the wave form generator comprising:
      a ramp generator having an output, the ramp generator to generate a ramp signal representative of the plurality of ramp steps at the output, and
      a power level generator having an output and a multiply input port coupled to the output of the ramp generator, the power level generator to generate the power level, the power level generator, responsive to the ramp signal at the multiply input port, to output a signal representative of the ramp-up portions.

5. A wireless communication device according to claim 4 wherein the ramp generator comprises:
   a counter;
   a lookup table coupled to the counter;
   a register coupled to the lookup table; and
   a DAC coupled to the register and the multiply input port.

6. A wireless communication device according to claim 4 wherein the power level generator comprises:
   a register; and
   a DAC coupled to the register and the power amplifier, the DAC having a multiply input port.

7. A wireless communication device comprising:
   an antenna;
   a receive section coupled to the antenna;
   a control section coupled to the receive section;
   a synthesizer section coupled to the control section and the receive section; and
   a transmit section coupled to the control section, the synthesizer section and the antenna, the transmit section comprising:
      a power amplifier coupled to the synthesizer section and the antenna, the power amplifier to amplify a signal output by the synthesizer section for transmission via the antenna, the power amplifier selectively controllable to amplify the signal to different output power levels;
      a coupler coupled between the power amplifier and the antenna, the coupler to generate a signal representative of an actual output power level of the amplified signal; and
      a power amplifier control section coupled to the control section, the power amplifier and the coupler, the power amplifier control section, responsive to an initiate transmit signal from the control section and high power mode data from the control section, to control the power amplifier to amplify the signal to a high output power level according to a predetermined amplitude waveform and, responsive to the initiate transmit signal and low power mode data from the control section, to control the power amplifier to amplify the signal to a low output power level according to a delayed one of the predetermined amplitude waveform, and the power amplifier control section further to modify controlling the power amplifier to amplify the signal to the high and low output power levels according to the signal generated by the coupler.

8. A wireless communication device according to claim 7 wherein the power amplifier control section comprises:

control circuitry comprising control logic, the control logic comprising a timer, the control circuitry coupled to the control section to receive the initiate transmit signal and control data, the control data at least comprising power mode data;

a ramp generator coupled to the control circuitry, the ramp generator, responsive to a timing signal from the control circuitry, to generate a ramp signal, the ramp generator comprising a counter coupled to the control logic, a lookup table coupled to the counter, the lookup table containing a plurality of ramp steps, a first register coupled to the lookup table and the control circuitry, and a first DAC coupled to the first register, the first DAC to output the ramp signal;

a power level generator coupled to the control circuitry, the control data register and the power amplifier, the power level generator, responsive to a timing signal from the control circuitry, to generate a signal representative of one of the predetermined amplitude waveform and the delayed one of the predetermined amplitude waveform, the power level generator comprising a second register coupled to the control section to receive power level data, and a second DAC coupled to the second register, the second DAC having a multiply input port coupled to the first DAC to receive the ramp signal, and the second DAC, responsive to the ramp signal, to output the signal representative of one of the predetermined amplitude waveform and the delayed one of the predetermined amplitude waveform.

9. A method of controlling a power amplifier, the power amplifier to amplify a signal for transmission, the method comprising the steps of:

receiving an initiate transmit signal;

starting a timer upon receipt of the initiate transmit signal;

generating a power amplifier control signal corresponding to predetermined amplitude waveform, the step of generating comprising the steps of:
programming a first DAC with a first offset value when the timer is started,
programming a second DAC with a first power value when the timer is started, and
summing the first offset value and the first power value;

setting the power amplifier to amplify the signal to a first output power level according to the predetermined amplitude waveform;

generating power amplifier control signal corresponding to a delayed one of the predetermined amplitude waveform; the step of generating comprising the steps of:
programming the first DAC with the first offset value only after a first predetermined period of time has elapsed on the timer,
programming the second DAC with the first power value only after the first predetermined period of time has elapsed on the timer, and
summing the first offset value and the first power value; and setting the power amplifier to amplify the signal to a second output power level different from the first output power level according to the delayed one of the predetermined amplitude waveform.

10. A method of controlling a power amplifier, the power amplifier to amplify a signal for transmission, the method comprising the steps of:

generating a power amplifier control signal corresponding to predetermined amplitude waveform, the step of generating comprising the step of generating the power amplifier control signal from a first ramp sequence representing a first steepness;

setting the power amplifier to amplify the signal to a first output power level according to the predetermined amplitude waveform;

generating a power amplifier control signal corresponding to a delayed one of the predetermined amplitude waveform, the step of generating comprising the step of generating the power amplifier control signal from a second ramp sequence representing a second steepness greater than the first steepness; and setting the power amplifier to amplify the signal to a second output power level different from the first output power level according to the delayed one of the predetermined amplitude waveform.

11. A method of controlling a power amplifier according to claim 10 wherein the step of generating the power amplifier control signal from a first ramp sequence comprises the step of creating the first ramp sequence from sequential ones of a plurality of ramp steps stored in a lookup table; and the step of generating the power amplifier control signal from a second ramp sequence comprises the step of creating the second ramp sequence from non-sequential ones of the plurality of ramp steps stored in the lookup table.

12. A method of controlling a power amplifier according to claim 11 wherein the step of creating the first ramp sequence comprises the steps of:
programming a first DAC with a first power value;
programming a second DAC with a first one of the plurality of ramp steps; and
multiplying the first power value by the first one of the plurality of ramp steps; and the step of creating the second ramp sequence comprises the steps of:
programming the first DAC with a second power value;
programming the second DAC with a second one of the plurality of ramp steps; and
multiplying the second power value by the second one of the plurality of ramp steps.

13. A method of controlling a power amplifier according to claim 10 wherein the step of generating the power amplifier control signal from a first ramp sequence comprises the steps of:
generating a first count on a counter by incrementing the counter by a first predetermined amount;

retrieving, for each count of the first count, one of a plurality of ramp steps from a lookup table, each of the plurality of ramp steps corresponding to a count of the counter; and programming, for each count on the first count, a DAC with the retrieved one of the plurality of ramp steps, the plurality of ramp steps retrieved from the lookup table according to the first count defining the first ramp sequence; and the step of generating the power amplifier control signal from a second ramp sequence comprises the steps of:

generating a second count on the counter by incrementing the counter by a second predetermined amount, the second predetermined amount at least twice as large as the first predetermined amount;

retrieving, for each count of the second count, one of the plurality of ramp steps from the lookup table; and programming, for each count on the second count, the DAC with the retrieved one of the plurality of ramp steps, the plurality of ramp steps retrieved from the lookup table according to the second count defining the second ramp sequence.

14. A method of controlling a power amplifier, the power amplifier to amplify a signal for transmission, the method comprising the steps of:

initializing a timer and a counter;

receiving control data, the control data at least comprising power level data and power mode data;

receiving an initiate transmit signal;

starting the timer upon receipt of the initiate transmit signal;

proceeding to the second step of generating when the power mode data indicates a low power mode and a first predetermined period of time has elapsed on the timer;

generating a power amplifier control signal corresponding to predetermined amplitude waveform;

setting the power amplifier to amplify the signal to a first output power level according to the predetermined amplitude waveform;

generating a power amplifier control signal corresponding to a delayed one of the predetermined amplitude waveform, the step of generating comprising the steps of:

incrementing the counter by a predetermined amount when the power mode data indicates a low power mode, programming a first DAC with the power level data, retrieving a ramp sequence step from a lookup table, the ramp sequence step corresponding to a present count of the counter, programming a second DAC with the retrieved ramp sequence step, and multiplying the power level data by the retrieved ramp sequence step to form the power amplifier control signal; and setting the power amplifier to amplify the signal to a second output power level different from the first output power level according to the delayed one of the predetermined amplitude waveform.

* * * * *

UNITED STATES PATENT AND TRADEMARK OFFICE
CERTIFICATE OF CORRECTION

PATENT NO.    : 6,169,886 B1
DATED         : January 2, 2001
INVENTOR(S)   : Gregory Black, et al.

It is certified that error appears in the above-identified patent and that said Letters Patent is hereby corrected as shown below:

Claim 4,
Line 20, please insert "to" after corresponding
Line 24, please change "wave form" to -- waveform --

Claim 9,
Line 65, please insert "a" after generating

Signed and Sealed this

Ninth Day of October, 2001

*Attest:*

NICHOLAS P. GODICI
*Attesting Officer*    Acting Director of the United States Patent and Trademark Office